United States Patent [19]

Anello et al.

[11] Patent Number: 4,719,125

[45] Date of Patent: Jan. 12, 1988

[54] CYCLOSILAZANE POLYMERS AS DIELECTRIC FILMS IN INTEGRATED CIRCUIT FABRICATION TECHNOLOGY

[75] Inventors: Louis G. Anello, Hamburg; Satish K. Gupta, Amherst, both of N.Y.; Stephen W. Kirtley, Sunnyvale, Calif.; George S. Wooster, Hamburg; Ralph L. DePrenda, Amherst, both of N.Y.

[73] Assignee: Allied Corporation, Morris Township, Morris County, N.J.

[21] Appl. No.: 924,111

[22] Filed: Nov. 3, 1986

Related U.S. Application Data

[63] Continuation of Ser. No. 786,421, Oct. 11, 1985, abandoned.

[51] Int. Cl.$^4$ ............................................. B05D 5/12
[52] U.S. Cl. .................................... 437/231; 427/387; 528/28; 528/37; 428/446; 428/447; 437/238
[58] Field of Search ................. 427/93, 94; 528/28, 528/37; 428/446, 447

[56] References Cited

U.S. PATENT DOCUMENTS

| | | | |
|---|---|---|---|
| 2,885,370 | 5/1959 | Groszos et al. | 260/2 |
| 3,143,514 | 8/1964 | Boyer | 528/28 |
| 3,228,895 | 1/1966 | Burks, Jr. et al. | 260/2 |
| 3,539,609 | 11/1970 | Fink | 528/37 |
| 3,652,324 | 3/1972 | Chu et al. | 427/94 |
| 4,103,045 | 7/1978 | Lesaicherre et al. | 427/93 |
| 4,656,300 | 4/1987 | Lebrun et al. | 528/28 |

OTHER PUBLICATIONS

Eaborn, "Organosilicon Compounds, Academic Press, Inc., New York, pp. 2-9 (1960).
R. E. Burks, Jr. et al., Journal of Applied Polymer Science, 9, pp. 2811-2817 (1965).
S. D. Brewer et al., J.A.C.S., 70, 3888 (1948).
E. Larsson et al., J.A.C.S., 75, 995-997 (1953).
R. Minne et al., J.A.C.S., 82, 5625-5628 (1960).

*Primary Examiner*—Melvyn I. Marquis
*Attorney, Agent, or Firm*—Harold N. Wells; Jay P. Friedenson

[57] ABSTRACT

An improved method is presented for the deposition of dielectric films in the fabrication of integrated circuits (ICs), wherein a solution of polymers derived from cyclosilazanes is employed to deposit dielectric films on semiconductor substrates by the spin-on technique. These spin-on films planarize (smooth out) underlying substrate topography and therefore are especially advantageous in multilevel metallization processes where they allow a highly uniform and continuous deposition of a subsequent layer of metallization resulting in improved yield and reliability of ICs.

16 Claims, 4 Drawing Figures

(COMPARATIVE)

CYCLOSILAZANE POLYMERS AS DIELECTRIC FILMS IN INTEGRATED CIRCUIT FABRICATION TECHNOLOGY

This application is a continuation of application Ser. No. 786,421 filed Oct. 11, 1985, now abandoned.

DESCRIPTION

This invention relates to the deposition of dielectric films in the fabrication of integrated circuits (ICs) and more particularly to the use of cyclosilazane polymeric materials for producing dielectric films on semiconductor substrates by spin-on or other techniques. Particulary advantageous is the use of these cyclosilazane polymeric materials for producing interlevel dielectric films by the spin-on technique to enhance the yield and reliability of IC devices due to the planarization of the substrate topography.

BACKGROUND OF THE INVENTION

Thin films of dielectric materials find a number of applications in today's IC fabrication technology including primary passivation and diffusion masking, interlevel dielectric insulation, overcoat passivation, and etch-masking. In all cases except one, the primary passivation and diffusion masking of silicon wafers where thermally grown oxide of silicon ($SiO_2$) is utilized, the dielectric films have conventionally been produced by the chemical vapor deposition (CVD) of inorganic glasses such as undoped and doped silica ($SiO_2$) silicon nitride ($Si_3N_4$).

The use of CVD processes to deposit dielectric films is associated with several problems including difficult control of film uniformity and composition, high level of pinhole and particulate type defects, handling of toxic and hazardous gases (e.g., silane, $SiH_4$ and phosphine, $PH_3$), and poor step-coverage (lack of planarization). The densely packed LSI (Large Scale Integration) and VLSI (Very Large Scale Integration) circuits are fabricated by utilizing multiple levels of conducting interconnect patterns separated by insulating layers.

The lack of ability in CVD films to planarize the underlying substrate topography is a particularly serious problem when CVD films are employed as an interlevel dielectric insulation layer that results in greatly reduced manufacturing yields and reliability of finished ICs.

Several techniques for effecting a partial planarization or smoothing of the CVD $SiO_2$ films have been developed over the years. In the so-called "Reflow Glass" processes, a CVD $SiO_2$ film containing 6-8% P is deposited on a substrate with first level interconnect and the substrate is subsequently heated in a diffusion furnace to a temperature of about 1050° C. for 15-30 minutes. Because of the high amounts of phosphorus, the softening point of the phosphosilicate glass is low enough that a partial flow of the film occurs resulting in a smoothing of the substrate topography. The process requires that the first level metallization material be resistant to the effect of thermal treatment at the reflow temperatures. Except in the case of the first level interconnect in MOS (Metal-Oxide-Semiconductor) device fabrication where polysilicon metallization is utilized, the interconnect generally consists of aluminum or aluminum alloys which cannot be subjected to temperatures much above 500° C. Thus, the Reflow Glass process is not universally applicable in interlevel insulation processes. Furthermore, in the State-of-the-Art technology the high temperature treatment produces two undesirable effects: dopant redistribution (change in dopant profiles) and substrate damage due to thermal stress. Other techniques for the planarization of deposited (CVD) film topography are based on external physical processes such as energetic ion-induced etching. However, such processes tend to be slow (low throughput), equipment-intensive, and liable to cause radiation damage in the substrate.

An alternative method to chemical vapor deposition is the application of thin dielectric films to substrates by the spin-on technique. In the spin-on process, a solution of an appropriate polymeric material is dispensed onto a substrate and the substrate rotated at high speeds (1–10,000 rpm) for a period of 10 seconds or so whereby a highly uniform film of the polymeric material is formed on the substrate. Following the spin-on application the film is dried and cured as necessary. Spun-on films have the inherent quality of planarizing the underlying substrate topography. Therefore, the spin-on processes offer a particularly desirable method of depositing dielectric layers for interlevel insulation and, in general, other applications in IC fabrication technology. However, the spin-on material/film, in order to be useful must meet a set of stringent requirements including: high mechanical integrity and quality, low density of microdefects (pinholes and particulates), good adhesion characteristics, suitable dielectric properties, resistance to chemical attack, low cure temperature, thermal stability, and compatibility with other materials and further IC fabrication processes. The film thickness range generally required is 1–3 microns.

In prior practice, polyimides, a class of high temperature organic polymers, have been evaluated as a spin-on dielectric material for a number of years. Although polyimides have adequate dielectric characteristics and can be spin-applied into films several microns thick, their use in IC fabrication technology has not been widespread. This is because of the difficult cure and processing involved with the use of polyimide films as well as certain inherent material limitations, including high moisture content of polyimide films, poor adhesion to substrate, and the degradation of dielectric properties at elevated temperatures. Thus, even though polyimides have been investigated as spin-on dielectric film materials, due to difficult processing requirements and some inherent shortcomings in material characteristics, they have not gained widespread use. Accordingly a need exists for improved film forming composition/systems for use in connection with integrated circuit manufacture.

SUMMARY OF THE INVENTION

In accordance with the invention, it is a primary objective to provide the use of substituted cyclosilazane polymers as a spin-on dielectric film material. Further objectives reside in the method of preparation of such polymers, formulation of spin-on solutions from the same, and procedures for producing spun-on films of characteristics appropriate for IC fabrication use. The invention provides a process for the deposition of dielectric films in IC fabrication technology, that offers the highly desirable improvement of substrate planarization over the conventional CVD processes while minimizing the problems associated with the use of polyimides. Additionally, the invention describes selected properties relevant to IC applications of films produced from typical polymers.

DETAILED DESCRIPTION OF THE INVENTION

Figure 1:
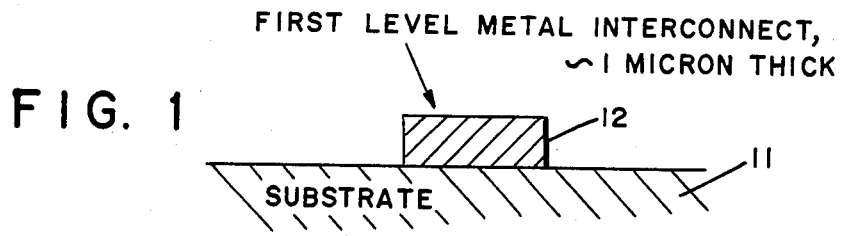
FIG. 1 shows the cross section of a segment of a metal line in the lower level of interconnect on a silicon or other semiconductor substrate.

The polymers for the practice of this invention are derived from a class of compounds known as cyclosilazanes (silylamines, more generally), having the general formula $(R_1R_2SiNH)_n$ wherein $R_1$ and $R_2$ are H or aliphatic groups of 1-12 C atoms or aryl groups of 6 to 15 C atoms and n has a value of 3 or 4. Preferred substituants for $R_1$ and $R_2$ are hydrogen, methyl, ethyl, cyclohexyl, phenyl and o-tolulyl. Such compounds have, respectively, the six and eight membered ring structures represented by:

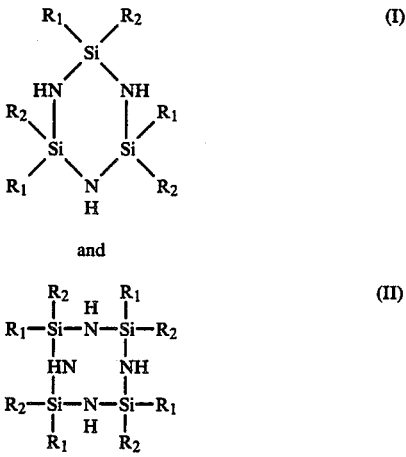

where $R_1$ and $R_2$ have the values above defined.

The preparation of the monomeric cyclosilazanes and their polymers is disclosed by S. J. Groszos, et al. in U.S. Pat. No. 2,885,370; R. E. Burks, Jr., et al. in U.S. Pat. No. 3,228,895; and R. E. Burks, Jr., et al. in the Journal of Applied Polymer Science, 9, pp 2811-2817 (1965). Other pertinent references are: S. D. Brewer, et al., J.A.C.S. 70 3888 (1948); E. Larsson, et al., J.A.C.S. 75 995 (1953); and R. Minne, et al., J.A.C.S. 82 5625 (1960).

A number of factors determine the characteristics of the silylamine polymer and consequently, of the spin-applied dielectric film, including the nature of $R_1$ and $R_2$ groups of the cyclosilazane molecule, purity of the monomer, time and temperature of the polymeriztion reaction, and the composition of the spin-on solution.

Preferably, $R_1$ and $R_2$ are selected from methyl and phenyl groups, although other groups apparent to thos skilled in the art can also be employed. $R_1$ and $R_2$ can be the same or different. Thus, hexaphenylcyclorisilazane, hexamethylcyclotrisilazane, and 2,4,6-trimethyl-2,4,6-triphenylcyclotrisilazane (or, methylphenylcyclotrisilazane) would be appropriate starting monomers for preparing the polymers. The methylphenyl silazane is the preferred monomer. Polymers obtained from hexaphenylcyclotrisilazane are relatively more brittle as compared to those from methylphenylcyclotrisilazane and therefore do not yield crack-free films. On the other hand, hexamethylcyclotrisilazane cannot be polymerized without the use of a catalyst such as KOH. However, polymers obtained by copolymerizing the hexaphenyl- and hexamethyl silazanes are suitable materials for forming the dielectric films of this invention.

The silylamine monomers are prepared by the reaction of $NH_3$ with the desired dicholorosilane, $R_1R_2SiCl_2$, in an anhydrous medium such as benzene, toluene, etc. The reaction products consist mainly of the cyclotrisilazane, $(R_1R_2SiNH)_3$ of the formula (I) with relatively minor (less than about 30%) amounts of the cyclotetrasilazane, $(R_1R_2SiNH)_4$, of the formula (II) and resinous by-products. Polymerization can be carried out using either the crude monomer mixture or the purified cyclotrisilazane. However, the polymerization of pure methylphenyl silazane yields polymeric solids that are insoluble in toluene or other organic solvents. Therefore, it is preferable to carry out the polymerization of the methylphenyl silazanes mixture.

Polymerization of the silylamine monomers is carried out by heating at atmospheric pressure at temperature from 400° C. to 500° C. until a viscous liquid is formed but before infusible and insoluble solid is formed. The degree of polymerization is controlled so as to yield a polymer that is soluble in toluene and other organic solvents yielding a solution that is readily filterable through a 0.2 micron membrane filter. At the same time, the degree of polymerization must be sufficiently high so that the polymer is not very volatile at the film cure temperatures of 400°-500° C. The preferred range of polymerization temperatures is 450° C.-500° C. which corresponds to reaction times of about 1 hour to 24 hours.

Generally, a 1-50 percent, preferably 10-40% (weight/weight) solution of the polymer is made in toluene, although a number of other solvents such as benzene, xylene, methyl-iso-butylketone, cyclopentanone, etc. can also be used. The selection of toluene as the preferred solvent is based on its relatively high evaporation rate which allows the deposition of thick, up to several microns, films by the spin-on technique while keeping the polymer concentration at reasonable levels, about 40% or lower. In order to obtain highly uniform and striation-free films, especially from high concentration solutions, the flow characteristics of the solution are improved by the addition of a surface active agent such as FC-430 (3M Co.) to the solution, preferably at 0.05-0.2% (weight/volume) levels. The solution is filtered through 0.2 micron pore Teflon membrane filters into clean glass bottles.

The spin-on deposition of the polymer dielectric film on silicon wafers is carried out under "clean room"

conditions using conventional photoresist spinners. Preferably, substrate spin speeds in the 2000–6000 rpm range are employed. After spin-on application, the films are prebaked at 100° C. for 15 minutes in air to evaporate off most of the solvent. The films are then cured in a furnace, in air ambient, for 60 minutes preferably at tempertures of 400°–450° C. During the cure, further crosslinking of the polymer takes place and the resultant film is insoluble in toluene or other solvents. The cured films are inert toward attack by common laboratory chemicals including mineral acids and KOH solutions at room temperature. If desired, the cured film can be further heated at a temperature of about 900° C. in oxygen or steam ambients to convert them to amorphous $SiO_2$ (silicon dioxide) films.

The spun-on films after cure are highly uniform, crack-free, and glassy in appearance. They have a very low density of pinholes and particulate defects, typically less than one defect (each type) per square centimeter. After a 400° C. cure, the films have a dielectric constant of 3.5±0.5 and a volume resistivity of the order of $10^{14}$ ohm-cm. The films can be readily etched in $CF_4+O_2$ plasmas for patterning purposes using a positive photoresist mask. The films are stable toward thermal treatments of up to 500° C. and attack by moisture or ambient corrosion. When applied to substrates containing patterned layers of aluminum or thermal $SiO_2$, approximately 1 micron thick, the polymer films yield a high degree of planarization of the substrate topography resulting in the desirable step-coverage profile of FIG. 4. Thus, the polymeric dielectric films of this invention have characteristics that are compatible with the requirements of today's IC fabrication technology.

Figure 2:
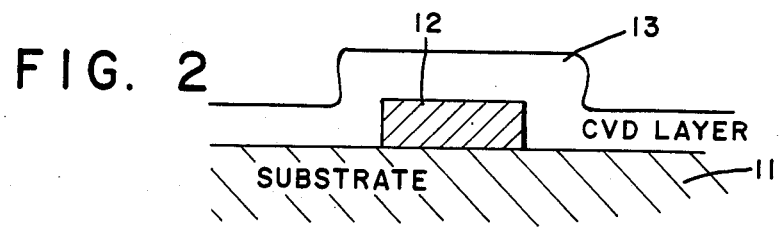
FIG. 2 shows a typical profile obtained after the deposition of a CVD layer on the metal line and substrate.

The invention will be further described by reference to the drawing wherein the sequence of a semiconductor component fabrication is illustrated. As shown in FIG. 1, a metal element 12, such as aluminum is deposited on a substrate 11 such as a silicon wafer. In convention technology, such as illustrated in FIG. 2, a chemical vapor deposition (CVD) layer 13 is deposited on the substrate.

Figure 3:
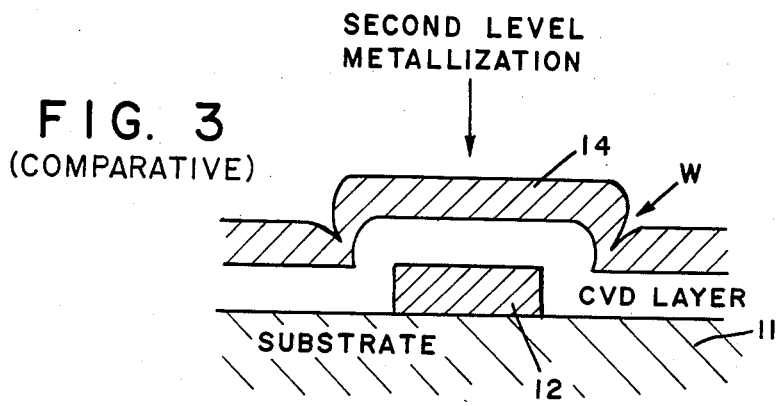
FIG. 3 is a comparative illustration to show topographical features of the kind frequently occurring in the prior art when a metallization layer is applied over the CVD layer and wherein the inadequate step-coverage results in 'opens' (discontinuities in conductor lines) which reduce device yields and weak spots (metal layer too thin) which degrade device reliability.

In FIG. 3, which is illustrative of the prior art, a profile of the second level metallization 14, that is obtained when a CVD layer is used is depicted. FIG. 3 shows areas W where the metal is either too thin or discontinuous; such defects impact adversely on reliability.

Figure 4:
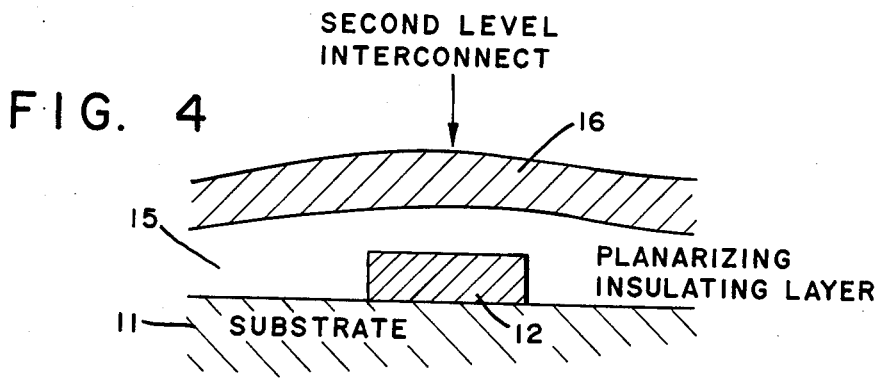
FIG. 4 illustrates the profile obtained with the method of the present invention, wherein the spun-on polymer film planarizes (smooths over) the underlying substrate feature which would allow the deposition of a continuous metallization layer of relatively constant thickness all over.

In FIG. 4, the system of the invention is illustrated and wherein the CVD layer is replaced by the spun applied polymeric layer 16 of the invention; this second metal layer 16 is continuous and of uniform thickness overall.

The following examples are given by way of illustration to show how suitable polymeric materials for the dielectric films of this invention are prepared.

EXAMPLE I

Preparation of Trimethyltriphenylcyclotrisilazane Polymer

Methylphenyldichlorosilane (353.5 g, 1.85 moles) was dissolved in 1 liter of dry toluene and stirred under an atmosphere of ammonia for 5 hours. The temperature rose to 80° C. during the reaction and dropped to 15° C. after the reaction was completed in the presence of excess ammonia. After a nitrogen purge, the ammonium chloride was removed from the product by filtration. The ammonium chloride was stirred with hot toluene and the washings were added to the filtrate. The toluene was removed by evaporation at reduced pressure. The product, 241 g (0.595 mole), a cloudy viscous oil, consisted mainly of the trimethyltriphenylcyclotrisilazane with small amounts of the cyclotetrasilazane and some resinous substance.

Fifty-three grams (0.13 mole) of the crude methylphenylcyclosilazane monomer were heated in a flask in a nitrogen atmosphere at a temperature of 480°–490° C. for about one hour whereupon it polymerized to a viscous liquid with the elimination of about 8 g (0.10 mole) of benzene. When cooled, the product was a glassy, brittle solid soluble in toluene and other organic liquids. The solid was dissolved in toluene at a 25% (wt./wt.) level and the solution filtered through a 0.2 micron Teflon membrane filter. The solution was spun onto a bare silicon wafer at 2000 rpm and the substrate was heated at 100° C. for 15 minutes followed by cure at 400° C. for 60 minutes. The resulting film was glassy in appearance and crack-free with thickness of about 12,000Å (1.2 microns).

EXAMPLE II

Polymerization of Trimethyltriphenylcyclotrisilazane

Sixty-four grams of methylphenylcyclotrisilazane monomer as prepared in Example I were heated in a flask in a nitrogen atmosphere at a temperature of 470° C. for 3½ hours whereupon it polymerized to a viscous liquid with the elimination of about 9.5 g of benzene. When cooled, the product (50 g) was a glassy brittle solid soluble in toluene and other organic solvents. The solid was dissolved in toluene at a 25% (wt./wt.) level ¼ and the solution, after filtration was spun onto the surface of a silicon wafer at 3000 rpm for 20 seconds. The treated wafer was heated to 100° C. for 15 minutes and to 400° C. for 1 hour which produced a 12,000Å thick, high quality glassy film with no surface cracking.

EXAMPLE III

Preparation of Hexaphenylcyclosilazane Polymer

Diphenyldichlorosilazane (233 g, 0.92 moles), dissolved in 500 ml of toluene, was reacted with ammonia to a temperature of 95° C. until no further reaction took place. The ammonium chloride was removed by filtration and the toluene removed by evaporation at reduced pressure. The product (167 g, 0.28 mole), a crystalline solid consisted mainly of the trimer $[(Ph)_2SiNH]_3$ with some tetramer $[(Ph)_2SiNH]_4$.

Fifty grams of the above monomer was heated in a nitrogen atmosphere at a temperature of 480°–490° C. for one hour whereupon it polymerized to a viscous liquid with the elimination of benzene. When cooled, the glass brittle solid was soluble in toluene and other organic liquids. The solid was dissolved in toluene at a 25% (wt./wt.) level and the solution was filtered through 0.2 micron membrane filter. Films of the polymer applied to a silicon wafer and cured as in Exmaple I showed extensive cracks and therefore were considered unsatisfactory for application in IC fabrication.

EXAMPLE IV

Copolymers of Dimethyl- and Diphenyl Substituted Cyclosilazane Mixture

Dimethyldichlorosilane (200 g., 1.55 moles) and diphenyldichlorosilane (393 g., 155 moles) dissolved in 1500 ml of toluene were reacted with ammonia at temperatures of 25° to 35° C. for a period of 6 hours until no further reaction took place. The ammonium chloride was removed from the product by filtration. The toluene was removed by evaporation under reduced pressure. The product, 450.7 g, a cloudy viscous oil consisted mainly of the cyclotrisilazane containing varying amounts of dimethyl- and diphenyl groups attached to silicon.

Sixty-two grams of the above monomer mixture were heated in a nitrogen atmosphere at a temperature of 400° C. for 1¼ hours where upon it polymerized to a viscous liquid with the elimination of about 15 g of benzene. When cooled, the glassy brittle polymer was soluble in toluene and other organic solvents. The solid was dissolved in toluene at a 20% (wt./wt.) level and the solution spun onto the surface of a silicon wafer at 3000 rpm for 20 seconds. The treated wafer after heating to 400° C. for one hour gaven an excellent film with no surface cracking.

EXAMPLE V

Copolymer of Methylphenylcyclotrisilazane and the Dimethylsilyl Derivative of Ethylene Diamine The dimethylsilyl derivative of ethylene diamine for use in this reaction was prepared by the reaction of 229 g (1.78 moles) of dimethyldichlorosilane with 300 g (5.0 moles) of ethylenediamine in 1000 ml of benzene at 50° C. over a 4 hour period. After filtration and removal of benzene, about 172 g of a brown solid was obtained.

Five grams of the above dimethylsilyamine polymer and 45 g of trimethyltriphenylcyclotrisilazane of Example I were copolymerized in a nitrogen atmosphere at a temperature of 480°–485° C. for 1½ hours. The glassy, brittle polymer solid was dissolved in toluene to a 35% (wt./wt.) level and the solution spun onto a silicon wafer and the wafer rotated at 7000 rpm for 20 seconds. After drying at 400° C. for 1 hour, a film thickness of about 19,000Å was obtained which was of high quality, glassy, with no cracking.

It will be understood that a great many variations in processing conditions and products may be made within the ranges disclosed herein; and therefore, we do not intend to limit except as set forth in the claims which follow.

What is claimed:

1. In a method for forming dielectric films on substrates wherein a solution of a polymeric material is deposited onto a silicon substrate and the substrate is rotated at a high speed whereby a uniform film of polymeric material is formed on the substrate, the improvement which comprises employing as the polymeric material a polymer or copolymer of a cyclosilazane soluble in organic solvents and having the formula $(R_1R_2SiNH)_n$, wherein $R_1$ and $R_2$ are hydrogen or aliphatic groups of 1–12 carbon atoms or aryl groups of 6–15 carbon atoms and n is 3 or 4 and curing said film at an elevated temperature for a period of time sufficient to crosslink said polymer and render it insoluble.

2. The method of claim 1 wherein the polymeric material is deposited as a solution in a solvent selected from at least one member of the group consisting of benzene, toluene, xylene, methyl-isobutyl ketone, and cyclopentanone.

3. The method of claim 2 wherein $R_1$ and $R_2$ are selected from hydrogen, methyl, ethyl, cyclohexyl, phenyl, or p-tolulyl radical.

4. The method of claim 3 wherein $R_1$ and $R_2$ are both methyl.

5. The method of claim 3 wherein $R_1$ and $R_2$ are both phenyl.

6. The method of claim 3 where $R_1$ is methyl and $R_2$ is phenyl.

7. The method of claim 1 wherein the polymer is a copolymer of hexamethylcyclotrisilazane and hexaphenylcyclotrisilazine.

8. The method of claim 1 wherein the polymer is a copolymer of the dimethylsilyl derivative of ethylenediamine and trimethyltriphenylcyclosilazane.

9. The method of claim 1 wherein the polymer is a copolymer of the dimethylsilyl derivative of ethylenediamine and hexaphenyltricyclosilazane.

10. The method of claim 1 wherein the cyclosilazane polymer is derived from silylamine monomers produced by the reaction of ammonia with a mixture of dimethyldichlorosilane and diphenyldichlorosilane.

11. The method of claim 1 wherein the concentration of the polymer is between about 1% (weight/weight) and about 50% weight/weight.

12. The method of claim 1 wherein the said deposited film is heated at a temperature of 400° C. to 450° C. until the said film is further polymerized to a glassy, infusible, and insoluble state.

13. A method for forming dielectric films on substrates comprising the steps of:
    (a) providing cyclosilazane monomers having the formula $(R_1R_2SiNH)_n$ where $R_1$ and $R_2$ are hydrogen or aliphatic groups of 1–12 carbon atoms or aryl groups of 6–15 carbon atoms and n is 3 or 4;
    (b) polymerizing the cyclosilazane of step (a) by heating at atmospheric pressure at 400° to 500° C. to yield a polymer soluble in organic solvents to provide a readily filterable solution;
    (c) spin depositing a 10–40 weight % solution of the polymer of step (b) in an organic solvent onto a silicon substrate;
    (d) baking the spin-deposited film of step (c) to evaporate the solvent;
    (e) curing the baked film in air at a temperature of 400°–450° C. to further polymerize the polymer to a glassy, infusible, and insoluble state.

14. The method of claim 13 wherein the polymerization of step (b) is carried out at 450°–500° C. for 1–24 hours.

15. The method of claim 13 further comprising the step of:
    (f) heating the cured film of step (c) to a temperature of about 900° C. in oxygen or steam to convert said film to amorphous silicon dioxide.

16. The method of claim 13 wherein the cyclosilazane monomer is prepared by the reaction of ammonia with the analogous dichlorosilane.

* * * * *